(12) United States Patent  
Nakamura

(10) Patent No.: US 11,430,696 B2  
(45) Date of Patent: Aug. 30, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 105 days.

(21) Appl. No.: 17/163,836

(22) Filed: Feb. 1, 2021

(65) Prior Publication Data

US 2021/0257256 A1     Aug. 19, 2021

(30) Foreign Application Priority Data

Feb. 14, 2020    (JP) .............................. JP2020-023244

(51) Int. Cl.
    *H01L 21/78*       (2006.01)
    *H01L 21/268*      (2006.01)
    *H01L 21/304*      (2006.01)

(52) U.S. Cl.
    CPC ............ *H01L 21/78* (2013.01); *H01L 21/268* (2013.01); *H01L 21/304* (2013.01)

(58) Field of Classification Search
    CPC ...... H01L 21/78; H01L 21/268; H01L 21/304
    See application file for complete search history.

(56) References Cited

U.S. PATENT DOCUMENTS

| | | | | |
|---|---|---|---|---|
| 2016/0172312 A1* | 6/2016 | Nakamura | .......... | H01L 21/6836 438/462 |
| 2019/0304800 A1* | 10/2019 | Yamamoto | ............. | B23K 26/38 |
| 2019/0326870 A1* | 10/2019 | Kai | .................... | H03H 9/02866 |
| 2020/0185276 A1* | 6/2020 | Kumazawa | ........... | H01L 23/544 |

FOREIGN PATENT DOCUMENTS

JP     2006108532 A     4/2006

\* cited by examiner

*Primary Examiner* — Thanh T Nguyen
(74) *Attorney, Agent, or Firm* — Greer Burns & Crain Ltd.

(57) ABSTRACT

There is provided a wafer processing method including a protective member disposing step of disposing a protective member on a top surface of a wafer; a modified layer forming step of forming an annular modified layer by irradiating the wafer with a laser beam so as to position, within a peripheral surplus region, a condensing point of the laser beam having a wavelength transmissible through the wafer; a separating step of separating a part or a whole of the peripheral surplus region from the wafer by dividing the wafer with the annular modified layer as a starting point; and a grinding step of thinning the wafer by grinding an undersurface of the wafer. In the modified layer forming step, the modified layer is formed in a shape of a circular truncated cone whose diameter is decreased from the top surface to the undersurface of the wafer.

2 Claims, 5 Drawing Sheets

WAFER PROCESSING METHOD

BACKGROUND OF THE INVENTION

Field of the Invention

The present invention relates to a method of processing a wafer that includes a device region having a plurality of devices formed on a top surface thereof and a peripheral surplus region surrounding the device region and having a chamfered portion formed thereon.

Description of the Related Art

A wafer having, on a top surface thereof, a device region having a plurality of devices such as integrated circuits (ICs) or large scale integration circuits (LSIs) demarcated by planned dividing lines and a peripheral surplus region surrounding the device region is formed to a predetermined thickness by grinding the undersurface of the wafer, and is thereafter divided into individual device chips by a dicing apparatus or a laser processing apparatus. The individual device chips are used in electric apparatuses such as mobile telephones or personal computers.

When the wafer is thinned by grinding the undersurface of the wafer, a chamfered portion formed at the outer circumferential edge of the wafer becomes sharp and thin like a knife edge, chipping occurs during the grinding, and a crack reaches the device region and damages the devices. Accordingly, the present applicant has proposed a technology of removing the peripheral surplus region having the chamfered portion by irradiating the peripheral surplus region with a laser beam before grinding the undersurface of the wafer (see Japanese Patent Laid-Open No. 2006-108532, for example).

SUMMARY OF THE INVENTION

However, even when a modified layer is formed by irradiating the inside of the peripheral surplus region including the chamfered portion with a laser beam having a wavelength transmissible through the wafer, for example, in order to remove the chamfered portion by irradiating the peripheral surplus region with the laser beam as in the technology described in Japanese Patent Laid-Open No. 2006-108532, and the ring-shaped region including the chamfered portion is to be removed from the wafer along the modified layer, the outside of the peripheral surplus region in which the modified layer is formed is not easily detached from the wafer, and thus, the work takes time.

It is accordingly an object of the present invention to provide a wafer processing method that can easily remove a ring-shaped region including a chamfered portion from a wafer by irradiating the inside of the peripheral surplus region including the chamfered portion with a laser beam.

In accordance with an aspect of the present invention, there is provided a wafer processing method of processing a wafer that includes a device region having a plurality of devices formed on a top surface of the device region and a peripheral surplus region surrounding the device region and having a chamfered portion formed on the peripheral surplus region. The method includes a protective member disposing step of disposing a protective member on a top surface of the wafer; a modified layer forming step of forming an annular modified layer by irradiating the wafer with a laser beam so as to position, within the peripheral surplus region, a condensing point of the laser beam having a wavelength transmissible through the wafer; a separating step of separating a part or a whole of the peripheral surplus region from the wafer by dividing the wafer with the annular modified layer as a starting point; and a grinding step of thinning the wafer by grinding an undersurface of the wafer. In the modified layer forming step, the modified layer is formed in a shape of a circular truncated cone whose diameter is decreased from the top surface to the undersurface of the wafer.

Preferably, in the modified layer forming step, the modified layer is also formed in a shape of an inverted circular truncated cone in addition to being formed in the shape of the circular truncated cone whose diameter is decreased from the top surface to the undersurface of the wafer.

In the wafer processing method according to one aspect of the present invention, the annular modified layer within the peripheral surplus region is formed in the shape of a circular truncated cone whose diameter is decreased from the top surface to the undersurface of the wafer. Thus, a part or a whole of the ring-shaped peripheral surplus region including the chamfered portion can easily be separated and removed from the wafer.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

A wafer processing method according to an embodiment of the present invention will hereinafter be described in detail with reference to the accompanying drawings.

Figure 1:
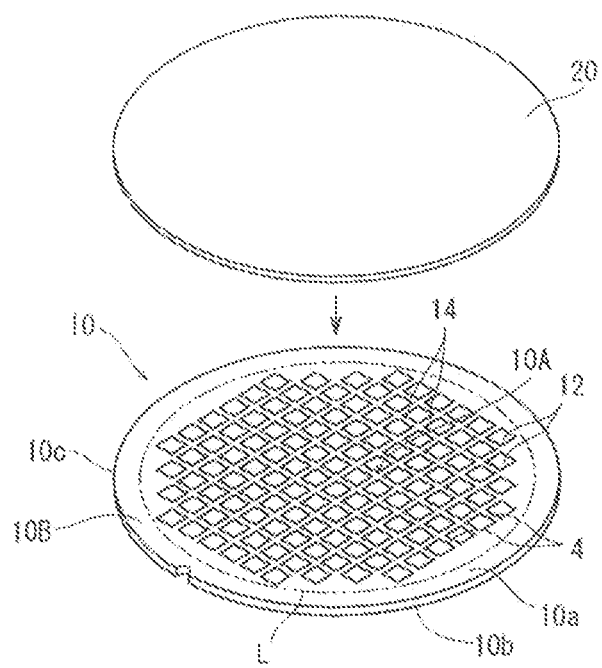
FIG. 1 is a perspective view depicting a protective member disposing step according to a present embodiment.

As depicted in FIG. 1, a processing target in the wafer processing method according to the present embodiment is, for example, a silicon (Si) wafer 10 that includes a device region 10A having a plurality of devices 12 such as ICs or LSIs demarcated on a top surface 10a by planned dividing lines 14 and a peripheral surplus region 10B surrounding the device region 10A. A chamfered portion 10c is formed on an end portion on the outer circumferential side of the wafer 10, the end portion forming the peripheral surplus region 10B. The wafer 10, for example, has a diameter of 300 mm and a thickness of 780 μm. The wafer 10 in the present embodiment is divided into individual device chips after being formed to a predetermined thickness by grinding an undersurface 10b. Incidentally, while an annular line L represented by a chain double-dashed line that divides the device region 10A and the peripheral surplus region 10B from each other is described on the top surface 10a of the wafer 10 depicted in FIG. 1, the line L is an imaginary line set for the convenience of description and is not actually provided on the wafer 10.

In performing the wafer processing method according to the present embodiment, an adhesive tape 20 that functions as a protective member is first affixed to the top surface 10a of the wafer 10, as depicted in FIG. 1 (protective member disposing step). An adhesive tape having a glue agent provided to the top surface of a base film such as polyethylene terephthalate (PET) or polyvinyl chloride (PVC) is used as the adhesive tape 20, for example. However, the adhesive tape 20 is not particularly limited.

Figure 2:
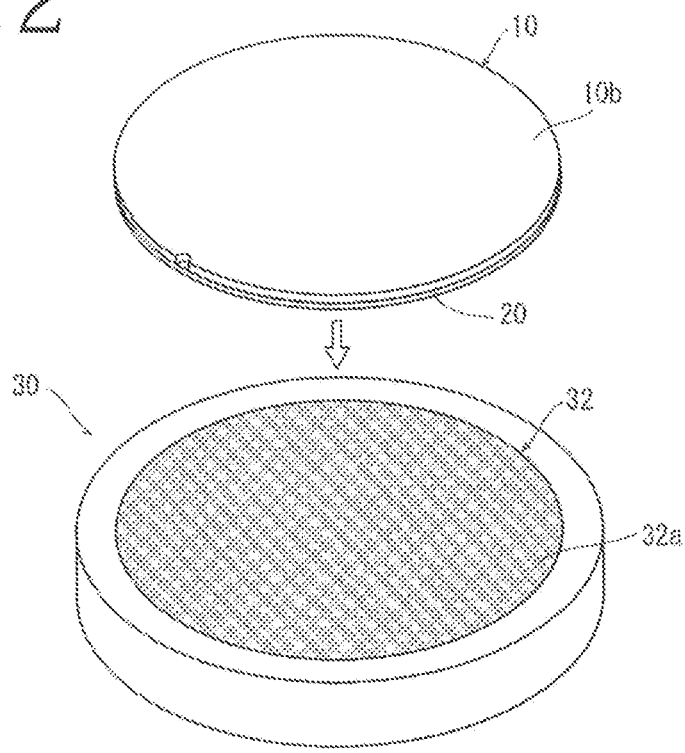
FIG. 2 is a perspective view depicting a manner in which a wafer is mounted and held on a chuck table when a modified layer forming step is performed.
Figure 3:
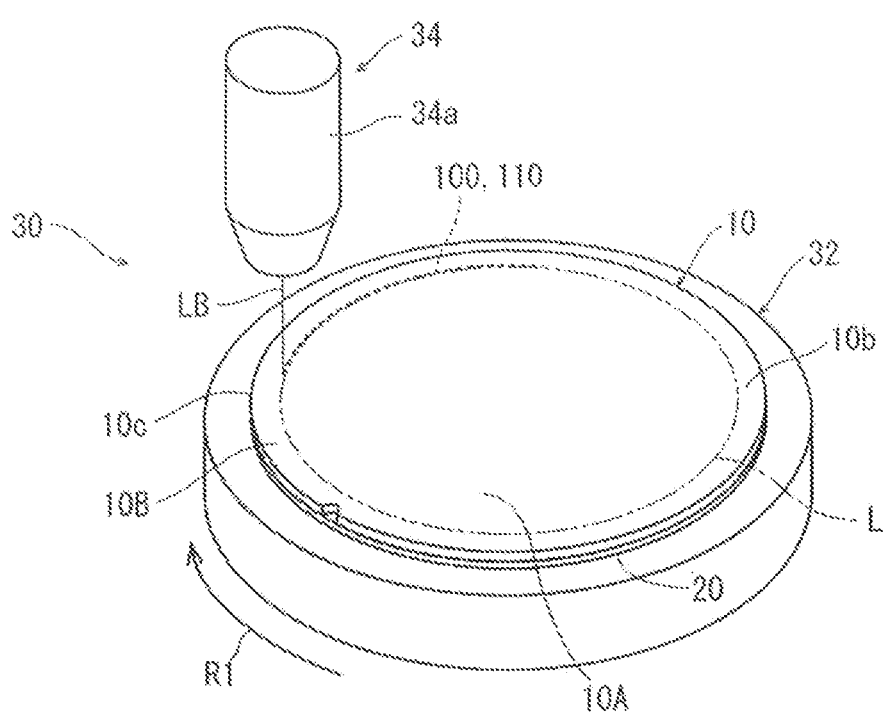
FIG. 3 is a perspective view depicting the modified layer forming step according to the present embodiment.

Next, the wafer 10 to which the adhesive tape 20 is affixed to be integrated therewith is transferred to a laser processing apparatus 30 depicted in FIG. 2 and FIG. 3 (only a part of the laser processing apparatus 30 is depicted). The wafer 10 is mounted on a holding surface 32a of a chuck table 32 with the undersurface 10b side of the wafer 10 oriented upward and with the adhesive tape 20 side oriented downward. The wafer 10 is then sucked and held on the holding surface 32a (see FIG. 2). After the wafer 10 is sucked and held on the chuck table 32, a predetermined alignment step is performed, a position (processing position) to be irradiated with a laser beam is detected, and the processing position to be irradiated with the laser beam is positioned below a condenser 34a constituting a laser beam irradiating unit 34, as depicted in FIG. 3. At this time, the processing position to be irradiated with the laser beam is set within the peripheral surplus region 10B and slightly outward of the line L dividing the device region 10A and the peripheral surplus region 10B from each other and is set on the inside of the chamfered portion 10c in a radial direction of the wafer 10.

After the wafer 10 is held on the chuck table 32 of the laser processing apparatus 30 and is positioned below the condenser 34a as described above, performed is a modified layer forming step which forms an annular modified layer by irradiating the wafer 10 with a laser beam LB so as to position, within the peripheral surplus region 10B, the condensing point (focus) of the laser beam LB having a wavelength transmissible through the wafer 10. The modified layer forming step in the present embodiment will be described more specifically with reference also to FIG. 4A.

The modified layer forming step in the present embodiment forms a plurality of annular modified layers. First, the condensing point of the laser beam LB is positioned at a position P1 close to the top surface 10a constituting the lower surface of the wafer 10 and having a depth of 750 μm, as viewed from the undersurface 10b constituting the upper surface of the wafer 10 having a thickness of 780 μm. After the condensing point of the laser beam LB is positioned at the position P1, an annular modified layer is formed within the peripheral surplus region 10B by rotating the chuck table 32 in a direction indicated by an arrow R1, as depicted in FIG. 3, while applying the laser beam LB from the condenser 34a of the laser beam irradiating unit 34.

Incidentally, laser processing conditions at a time of performing the above-described laser processing are set as follows, for example.

Wavelength: 1,342 nm
Repetition frequency: 60 kHz
Average power: 1.6 W
Chuck table rotational speed: 0.5 times/sec After the annular modified layer is formed within the peripheral surplus region 10B of the wafer 10 with the condensing point of the laser beam LB positioned at the position P1 as described above, the application of the laser beam LB is temporarily stopped, and the position of the condensing point is moved inward (to the device region 10A side) by 4 μm from the position P1 and moved to the upper surface (undersurface 10b) side by 90 μm, that is, to a depth position of 660 μm as viewed from the undersurface 10b. A modified layer is then formed within the peripheral surplus region 10B in a similar manner to the above by application of the laser beam LB. Thereafter, similarly, the position of the condensing point is moved inward by 4 μm and upward by 90 μm at a time (P1 . . . P2 . . . P3) along the direction of an arrow indicated by (1) in FIG. 4A, and modified layers 100 are formed by applying the laser beam LB. Incidentally, the position P3 closest to the undersurface 10b in the present embodiment is, for example, a position inward by 28 μm from the first position P1 and at a depth of 120 μm from the undersurface 10b.

That is, a plurality of the modified layers 100 are formed in the shape of a circular truncated cone (circular truncated conical shape) whose diameter is decreased from the top surface 10a (lower surface) of the wafer 10 to the undersurface 10b (upper surface) of the wafer 10, and are arranged along a curved surface having an angle of inclination θ of approximately 2.4 degrees with respect to a vertical direction. Incidentally, in FIG. 4, the angle of inclination of the curved surface along which the modified layers 100 are arranged is depicted larger than an actual angle for the convenience of description. In addition, the angle of inclination of the curved surface along which the modified layers 100 are arranged with respect to the vertical direction is not limited to 2.4 degrees described above and is preferably set in a range of approximately 2 degrees to 5 degrees, for example, by adjusting intervals at which the position of the condensing point is moved inward, as appropriate. As a result of the above, the modified layer forming step is completed.

Figure 5A:
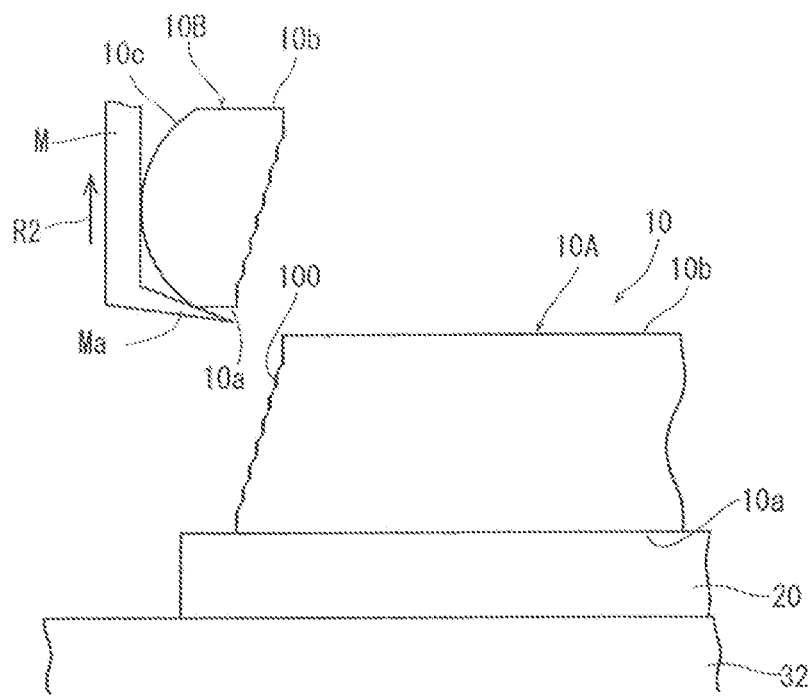
FIG. 5A is a side view depicting, in enlarged dimension, a part of the wafer and the like when a separating step is performed after the modified layer forming step depicted in FIG. 4A is performed.

Next, performed is a separating step which separates, from the wafer 10, a part of the peripheral surplus region 10B which is on the outside of the modified layers 100, by dividing the wafer 10 with the annularly formed modified layers 100 as a starting point. In the separating step, as depicted in FIG. 5A, in a state in which the wafer 10 is sucked and held by the chuck table 32, a pawl portion Ma of a separating lever M, for example, is positioned at the top surface 10a constituting the lower surface of the peripheral surplus region 10B on the outside of the position in which the modified layers 100 are formed. The pawl portion Ma is then lifted upward (direction indicated by an arrow R2). Thus, the peripheral surplus region 10B in the shape of a ring including the chamfered portion 10c is separated easily along the curved surface (slope) along which the modified layers 100 are arranged, and the wafer 10 in the shape of a circular truncated cone (circular truncated conical shape) including the device region 10A is left on the chuck table 32. Incidentally, though not depicted, the pawl portion Ma of the separating lever M is preferably positioned at at least three positions of the peripheral surplus region 10B of the wafer 10 at equal intervals in a circumferential direction. As a result of the above, the separating step is completed.

Figure 6A:
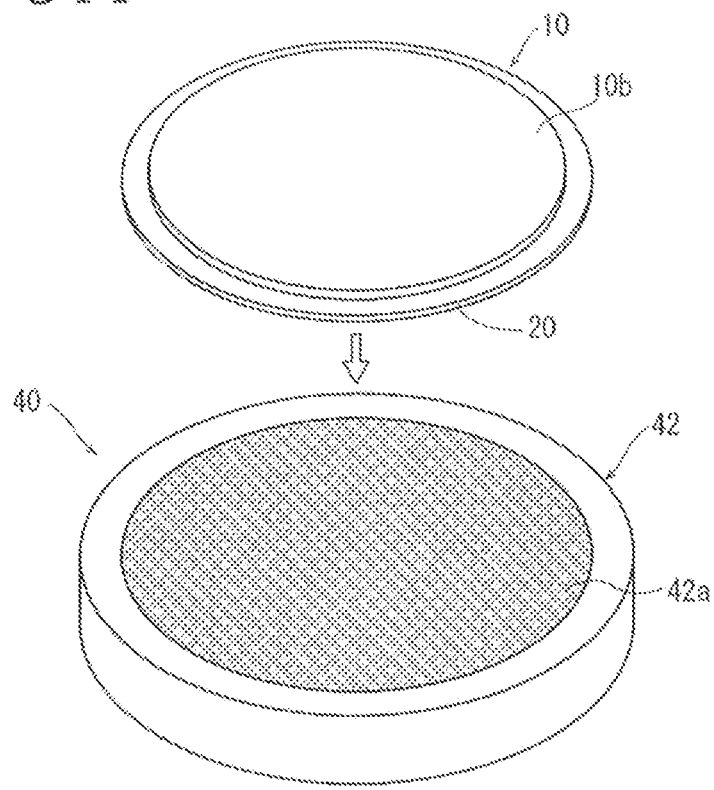
FIG. 6A is a perspective view depicting a manner in which the wafer is mounted on a chuck table of a grinding apparatus.

After the above-described separating step is performed, the wafer 10 from which the chamfered portion 10c is removed is transferred to a grinding apparatus 40 depicted in FIG. 6A (only a part of the grinding apparatus 40 is depicted). The wafer 10 is mounted on a holding surface 42a of a chuck table 42 with the undersurface 10b of the wafer 10 oriented upward and with the adhesive tape 20 side oriented downward. The wafer 10 is then sucked and held on the holding surface 42a.

Figure 6B:
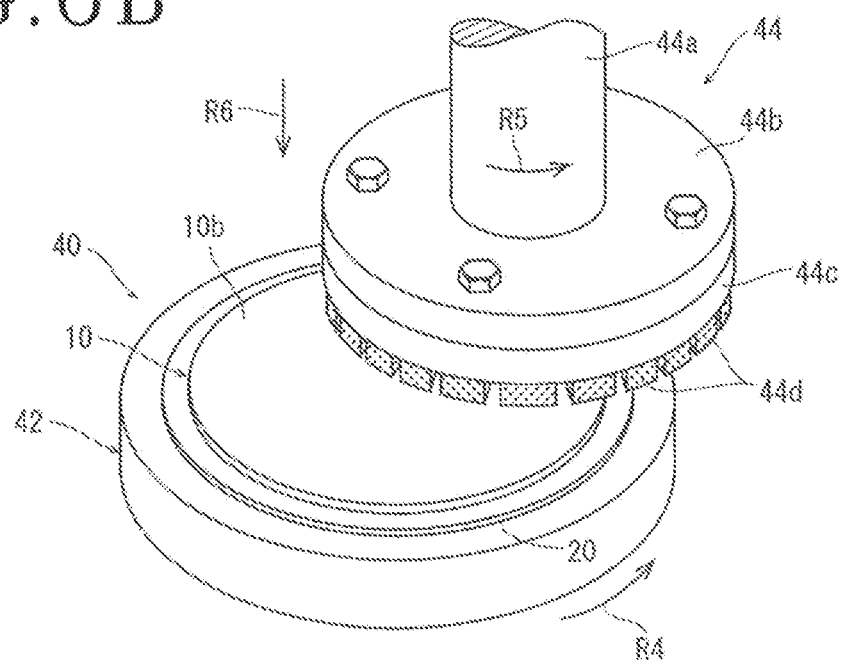
FIG. 6B is a perspective view depicting a grinding step.

As depicted in FIG. 6B, the grinding apparatus 40 has a grinding unit 44. The grinding unit 44 includes a spindle 44a disposed rotatably and a servomotor (not depicted) as a driving source for rotationally driving the spindle 44a. A disk-shaped mount 44b is disposed on a lower end portion of the spindle 44a. A grinding wheel 44c is disposed on the lower surface of the mount 44b. Then, a plurality of grinding stones 44d are arranged annularly on the lower surface of the grinding wheel 44c.

In performing a grinding step, as depicted in FIG. 6B, the wafer 10 sucked and held on the chuck table 42 is positioned below the grinding unit 44. Next, the chuck table 42 is rotated at a rotational speed of 300 rpm, for example, in a direction indicated by an arrow R4, and the spindle 44a is rotated at a rotational speed of 6,000 rpm in a direction indicated by an arrow R5. Next, the grinding unit 44 is lowered in a direction indicated by an arrow R6 and made to abut against the undersurface 10b of the wafer 10 by actuating a grinding feed mechanism not depicted. The undersurface 10b of the wafer 10 is ground when the grinding stones 44d of the grinding unit 44 abut against the undersurface 10b of the wafer 10. A grinding feed speed at a time of grinding the undersurface 10b of the wafer 10 is set at 0.1 μm/sec, for example. The grinding step is completed when the wafer 10 is ground to a desired thickness such as 100 μm in the grinding step.

As described above, according to the present embodiment, the modified layers 100 are formed in the shape of a circular truncated cone (circular truncated conical shape) whose diameter is decreased from the top surface 10a to the undersurface 10b of the wafer 10 when the modified layer forming step is performed, and the peripheral surplus region 10B including the chamfered portion 10c is separated by performing the separating step. Thus, no knife edge is formed even when the grinding step of grinding and thinning the undersurface 10b of the wafer 10 is performed. In addition, when the peripheral surplus region 10B including the chamfered portion 10c is separated from the wafer 10, the peripheral surplus region 10B is separated easily because the modified layers 100 are formed in the shape of a circular truncated cone.

Figure 4A:
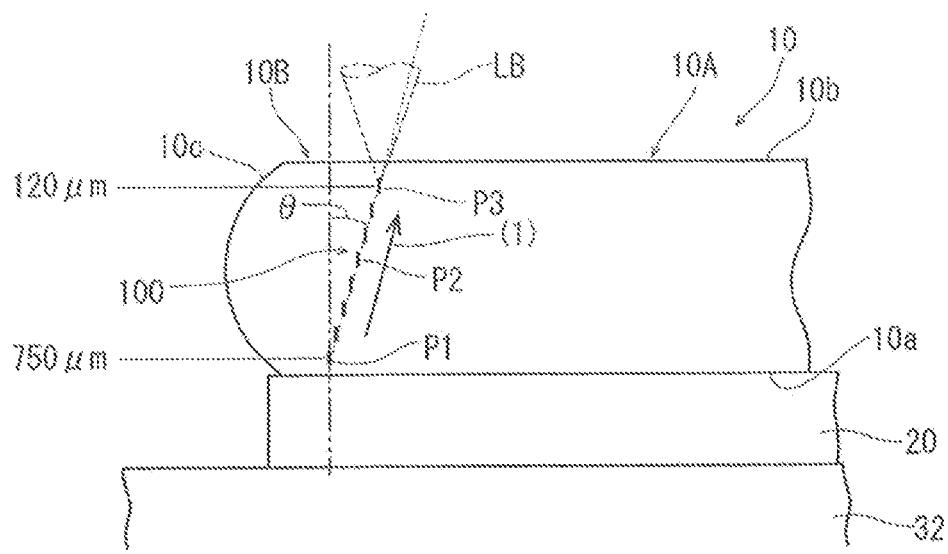
FIG. 4A is a partial enlarged sectional view depicting a manner in which modified layers are formed within a peripheral surplus region by performing the modified layer forming step depicted in FIG. 3.
Figure 4B:
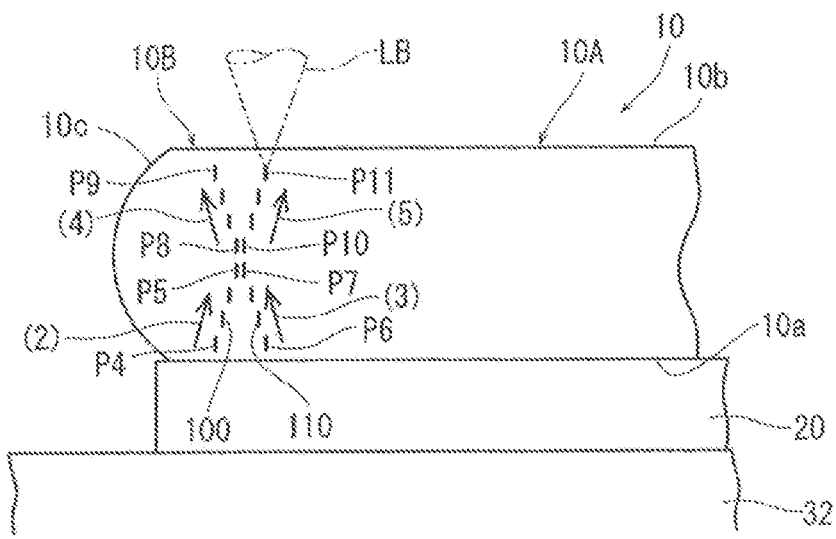
FIG. 4B is a partial enlarged sectional view depicting a modified layer forming step in a mode different from that in FIG. 4A.

Incidentally, in the foregoing embodiment, when the modified layers 100 are formed, the modified layers 100 are formed in the shape of a circular truncated cone whose diameter is decreased from the top surface 10a to the undersurface 10b of the wafer 10, as depicted in FIG. 4A, and thereafter, the above-described separating step is performed. However, the present invention is not limited to this. For example, as depicted in FIG. 4B, in addition to the modified layers 100 formed in the shape of a circular truncated cone whose diameter is decreased from the top surface 10a to the undersurface 10b of the wafer 10, modified layers 110 may be formed in the shape of a circular truncated cone having a bottom surface on the undersurface 10b side and having an upper surface on the top surface 10a side, that is, in the shape of a circular truncated cone in an inverted orientation with respect to the shape of the circular truncated cone of the above-described modified layers 100 (in the shape of an inverted circular truncated cone) (in the shape of a circular truncated cone whose diameter is increased from the top surface to the undersurface of the wafer). Another embodiment of forming the modified layers 100 and the modified layers 110 will be described more specifically with reference to FIG. 4B.

First, as in the modified layer forming step described earlier, the condensing point of the laser beam LB is positioned at a position P4 (=P1) within the peripheral surplus region 10B, the position P4 (=P1) being close to the top surface 10a and having a depth of 750 μm as viewed from the undersurface 10b constituting the upper surface of the wafer 10. After the condensing point of the laser beam LB is positioned at the position P4, an annular modified layer is formed within the peripheral surplus region 10B by applying the laser beam LB from the condenser 34a of the laser beam irradiating unit 34 on the basis of laser processing conditions similar to those in the above-described modified layer forming step and by rotating the chuck table 32 in the direction indicated by the arrow R1, as depicted in FIG. 3. Next, the laser processing is temporarily stopped, the position of the condensing point is moved inward (to the device region 10A side) by 4 μm from the position P4 and moved to the upper surface (undersurface 10b) side by 90 μm (to a depth position of 660 μm as viewed from the undersurface 10b), and then, similar processing is performed. Similar processing is repeated while the position of the condensing point is moved sequentially in a direction indicated by (2) in a similar manner to the above. A plurality of modified layers are thereby formed within the peripheral surplus region 10B and up to a position indicated by P5.

After the condensing point is positioned at the position P5 and the modified layers are formed as described above, the application of the laser beam LB is next stopped temporarily, and then, an annular modified layer is formed by applying the laser beam LB so as to position the condensing point at a position P6 which is located at the same depth as the above-described position P4 as viewed from the undersurface 10b, that is, at a depth of 750 μm as viewed from the undersurface 10b, and which is located inward by 28 μm as viewed from the position P4, and by rotating the chuck table 32. After the modified layer is thus formed at the position P6, the application of the laser beam LB is temporarily stopped, the position of the condensing point is moved outward (to the peripheral surplus region 10B side) by 4 μm from the position P6 and moved to the upper surface (undersurface 10b) side by 90 μm, that is, to a depth position of 660 μm as viewed from the undersurface 10b, and similar processing is performed. Similar processing is repeated while the position of the condensing point is moved sequentially in a direction indicated by (3) in a similar manner to the above. A plurality of modified layers are thereby formed within the peripheral surplus region 10B and up to a position indicated by P7. After the modified layers are formed up to the position indicated by P7, the position of the condensing point is further moved outward (to the peripheral surplus region 10B side) by 4 μm from the position P7 and moved to the upper surface (undersurface 10b) side to a position P8 higher by 90 μm, and a modified layer is formed by application of the laser beam LB while the chuck table 32 is rotated. Incidentally, the position P8 is a position coinciding with the position P5 as viewed from above or below. After the modified layer is formed at the position P8, similar processing is further repeated while the position of the condensing point is sequentially moved in a direction indicated by (4), that is, to a position outward (to the peripheral surplus region 10B side) by 4 μm and higher by 90 μm to the upper surface (undersurface 10b) side. A plurality of modified layers are formed up to a position indicated by P9.

After an annular modified layer is formed at a position corresponding to the position P9 as described above, the condensing point is next positioned at a position indicated by P10. The position P10 is at a depth position coinciding with that of the above-described position P8 and is a position coinciding with the position P7 as viewed from above or below. After the condensing point is positioned at such a position P10, a modified layer is formed by applying the laser beam under laser processing conditions similar to the above-described laser processing conditions while the chuck table 32 is rotated. Then, the position of the condensing point is sequentially moved in a direction indicated by (5), that is, to a position inward (to the device region 10A side) by 4 μm and higher by 90 μm to the upper surface (undersurface 10b) side, and similar processing is repeated. After a plurality of modified layers are thereby formed up to a position indicated by P11, the modified layer forming step is completed.

According to the foregoing other embodiment, the modified layers 100 are formed along the directions indicated by (2) and (5) in FIG. 4B, and thereby, the modified layers 100 are formed in the shape of a circular truncated cone (circular truncated conical shape) whose diameter is decreased from the top surface 10a to the undersurface 10b of the wafer 10. In addition, the modified layers 110 are formed along the directions indicated by (3) and (4) in FIG. 4B, and thereby, the modified layers 110 are formed in the shape of an inverted circular truncated cone (inverted circular truncated conical shape) vertically inverted with respect to the shape of the circular truncated cone of the modified layers 100. Incidentally, when the modified layer forming step is thus performed, the modified layers on the lower side are always formed first even in a case where the modified layers are formed at positions coinciding with each other as viewed from above or below. The modified layers 100 and the modified layers 110 are thus formed excellently.

Figure 5B:
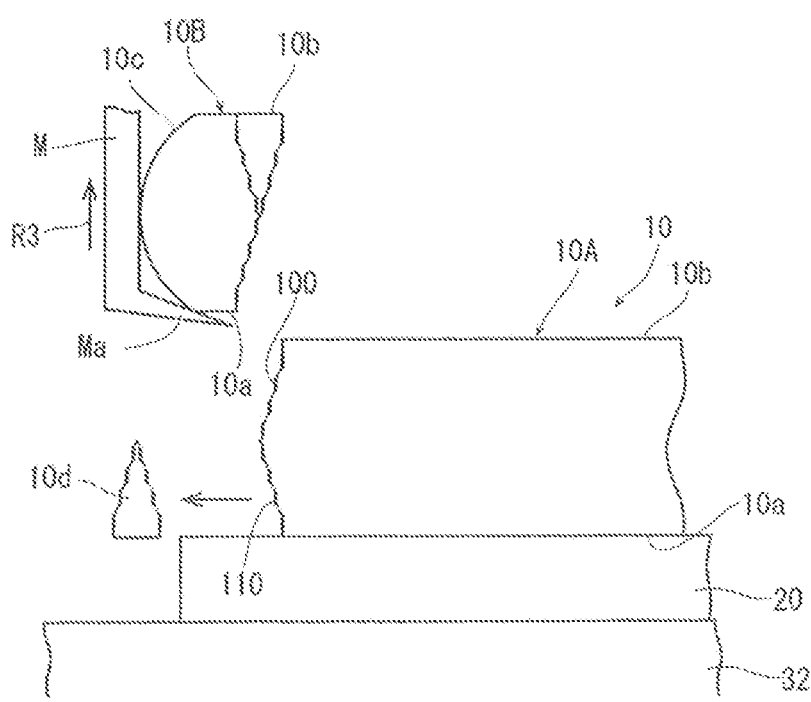
FIG. 5B is a side view depicting, in enlarged dimension, a part of the wafer and the like when the separating step is performed after the modified layer forming step depicted in FIG. 4B is performed.

Even in a case where the modified layers 100 and 110 are formed by the foregoing other embodiment, the peripheral surplus region 10B in the shape of a ring including the chamfered portion 10c can be separated easily by dividing the wafer with the annularly formed modified layers 100 and 110 as a starting point through the separating step as in the foregoing embodiment, as depicted in FIG. 5B. After the modified layer forming step is performed as described above, the wafer 10 is thinned until a desired thickness is obtained by performing the above-described grinding step.

When the peripheral surplus region 10B is separated from the wafer 10 after the modified layers 100 and 110 are formed according to the foregoing other embodiment, a region 10d surrounded by the modified layers 100 and the modified layers 110 is further separated. Thus, the peripheral surplus region 10B is separated more easily, and the outer circumferential edge of the wafer 10 has an excellent shape without a knife edge being formed even when the undersurface 10b is ground.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of processing a wafer that includes a device region having a plurality of devices formed on a top surface of the device region and a peripheral surplus region surrounding the device region and having a chamfered portion formed on the peripheral surplus region, the method comprising:
   a protective member disposing step of disposing a protective member on a top surface of the wafer;
   a modified layer forming step of forming an annular modified layer by irradiating the wafer with a laser beam so as to position, within the peripheral surplus region, a condensing point of the laser beam having a wavelength transmissible through the wafer;
   a separating step of separating a part or a whole of the peripheral surplus region from the wafer by dividing the wafer with the annular modified layer as a starting point; and
   a grinding step of thinning the wafer by grinding an undersurface of the wafer, wherein,
   in the modified layer forming step, the modified layer is formed in a shape of a circular truncated cone whose diameter is decreased from the top surface to the undersurface of the wafer.

2. The wafer processing method according to claim 1, wherein,
   in the modified layer forming step, the modified layer is also formed in a shape of an inverted circular truncated cone in addition to being formed in the shape of the circular truncated cone whose diameter is decreased from the top surface to the undersurface of the wafer.

* * * * *